United States Patent

Kim et al.

Patent Number: 5,814,538
Date of Patent: Sep. 29, 1998

[54] METHODS OF FORMING BICMOS DEVICES HAVING DUAL-LAYER EMITTER ELECTRODES AND THIN-FILM TRANSISTORS THEREIN

[75] Inventors: Young-ok Kim; Jong-mil Youn, both of Kyungki-do, Rep. of Korea

[73] Assignee: Samsung Electronics Co., Ltd., Rep. of Korea

[21] Appl. No.: 820,979

[22] Filed: Mar. 19, 1997

[30] Foreign Application Priority Data

Mar. 19, 1996 [KR] Rep. of Korea .................. 96-7375

[51] Int. Cl.$^6$ ............................... H01L 21/265
[52] U.S. Cl. .................................. 438/153; 438/202
[58] Field of Search .................. 438/201–210, 438/564, 153

[56] References Cited

U.S. PATENT DOCUMENTS

| | | | |
|---|---|---|---|
| 4,101,350 | 7/1978 | Possley et al. | 148/175 |
| 4,504,332 | 3/1985 | Shinada | 148/187 |
| 4,531,282 | 7/1985 | Sakai et al. | 29/578 |
| 4,583,106 | 4/1986 | Anantha et al. | 357/35 |
| 4,641,416 | 2/1987 | Iranmanesh et al. | 29/576 W |

(List continued on next page.)

FOREIGN PATENT DOCUMENTS

| | | |
|---|---|---|
| 56-43754 | 4/1981 | Japan . |
| 56-83063 | 7/1981 | Japan . |
| 63-215068 | 9/1988 | Japan . |
| 2-1934 | 1/1990 | Japan . |
| 2-1936 | 1/1990 | Japan . |
| 2-58335 | 2/1990 | Japan . |
| 2-151037 | 6/1990 | Japan . |

OTHER PUBLICATIONS

C. Subramanian et al., A Full–Wafer SOI Process For 3 Dimensional Integration, 9th Biennial University Government Industry Microelectronics Symposium, Melbourne, Fl. pp. 195–198, Jun. 12–14, 1991.

J. Glenn et al.,High–Speed Fully Self–Aligned Single–Crystal Contacted Silicon Bipolar Transistor, Electronics Letters, vol. 26, No. 20, Sep. 27, 1990, pp. 1677–1678.

S. Konaka et al., A 20–ps Si Bipolar IC Using Advanced Super Self–Aligned Process Technology With Collector Ion Implantation, IEEE Transactions on Electron Devices, vol. ED–36, No, 7, pp. 1370–1375, Jul. 1989.

Y. Yamamoto et al., SDX: A Novel Self–Aligned Technique And Its Application To High–Speed Bipolar LSI's, IEEE Transactions on Electron Devices, vol. ED–35, No. 10, pp. 1601–1608, Oct. 1988.

(List continued on next page.)

Primary Examiner—John F. Niebling
Assistant Examiner—Michael S. Lebentritt
Attorney, Agent, or Firm—Myers Bigel Sibley & Sajovec, P.A.

[57] ABSTRACT

A method for forming a bipolar transistor comprises the following steps. A collector region of a first conductivity type is formed in a substrate adjacent a surface thereof. A base region of a second conductivity type is then formed in the collector region adjacent the surface of the substrate. A base electrode is formed on a first portion of the substrate adjacent the base region wherein the base electrode comprises a dopant of the second conductivity type. Next, an emitter electrode is formed on a second portion of the substrate adjacent the base region wherein the emitter electrode comprises a dopant of the first conductivity type. The dopant of the second conductivity type from the base electrode is diffused into the first portion of the base region to increase a dopant concentration of the first portion of the base region adjacent the base electrode. The dopant of the first conductivity type from the emitter electrode is diffused into the second portion of the substrate to form an emitter region of the first conductivity type in the base region adjacent the emitter electrode. Advantageously, the first and second diffusion steps can be performed simultaneously in order to reduce the number of steps.

14 Claims, 4 Drawing Sheets

U.S. PATENT DOCUMENTS

| | | | |
|---|---|---|---|
| 4,829,016 | 5/1989 | Neudeck | 437/31 |
| 4,830,972 | 5/1989 | Hamasaki | 437/31 |
| 4,849,371 | 7/1989 | Hansen et al. | 437/82 |
| 4,851,362 | 7/1989 | Suzuki | 437/31 |
| 4,891,328 | 1/1990 | Gris | 438/204 |
| 4,900,689 | 2/1990 | Bajor et al. | 437/31 |
| 4,927,774 | 5/1990 | Welbourn et al. | 437/31 |
| 4,974,045 | 11/1990 | Okita | 357/34 |
| 4,988,632 | 1/1991 | Pfiester | 437/31 |
| 4,997,775 | 3/1991 | Cook et al. | 437/31 |
| 5,017,990 | 5/1991 | Chen et al. | 357/34 |
| 5,026,654 | 6/1991 | Tanba et al. | 437/31 |
| 5,118,633 | 6/1992 | Sagara et al. | 438/210 |
| 5,118,634 | 6/1992 | Neudeck et al. | 437/31 |
| 5,175,607 | 12/1992 | Ikeda | 437/141 |
| 5,177,582 | 1/1993 | Meister et al. | 257/588 |
| 5,288,652 | 2/1994 | Wang et al. | 438/202 |
| 5,382,828 | 1/1995 | Neudeck et al. | 257/586 |
| 5,434,092 | 7/1995 | Neudeck et al. | 437/34 |
| 5,494,844 | 2/1996 | Suzuki | 438/564 |
| 5,541,120 | 7/1996 | Robinson et al. | 438/202 |
| 5,541,137 | 7/1996 | Manning et al. | 438/564 |
| 5,614,422 | 3/1997 | Beasom | 437/31 |
| 5,637,516 | 6/1997 | Muller | 438/203 |
| 5,665,615 | 9/1997 | Anmo | 438/202 |
| 5,668,397 | 9/1997 | Davis et al. | 257/520 |
| 5,686,322 | 11/1997 | Beasom | 437/31 |

OTHER PUBLICATIONS

K. Washio et al., Fabrication Process and Device Characteristics Of Sidewall Base Contact Structure Transistor Using Two–Step Oxidation Of Sidewall Surface, IEEE Transactions On Electron Devices, vol. ED–35, No. 10, pp. 1596–1599, Oct. 1988.

S. Konaka et al., *A 30–ps Si Bipolar IC Using Super Self–Aligned Process Technology,* IEEE Transactions On Electron Devices, vol. ED–33, No. 4, pp. 526–531, Apr. 1986.

T. Sakai et al., High–Speed Bipolar ICs Using Super Self–Aligned Process Technology, Japanese Journal of Applied Physics, vol. 20, Supplement 20–1, 1981, pp. 155–159.

T. Chen et al., A Submicrometer High–Performance Bipolar Technology, IEEE Electron Device Letters, vol. 10, No. 8, Aug. 1989, pp. 364–366.

D. Tang et al., A Symmetrical Bipolar Structure, 1980 IEDM, Digest of Technical Papers, pp. 58–60 Month Unknown.

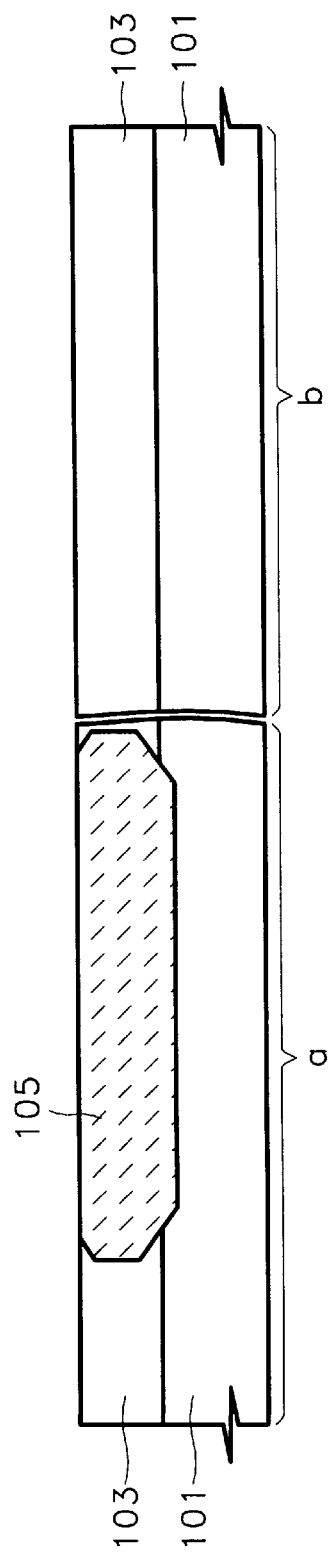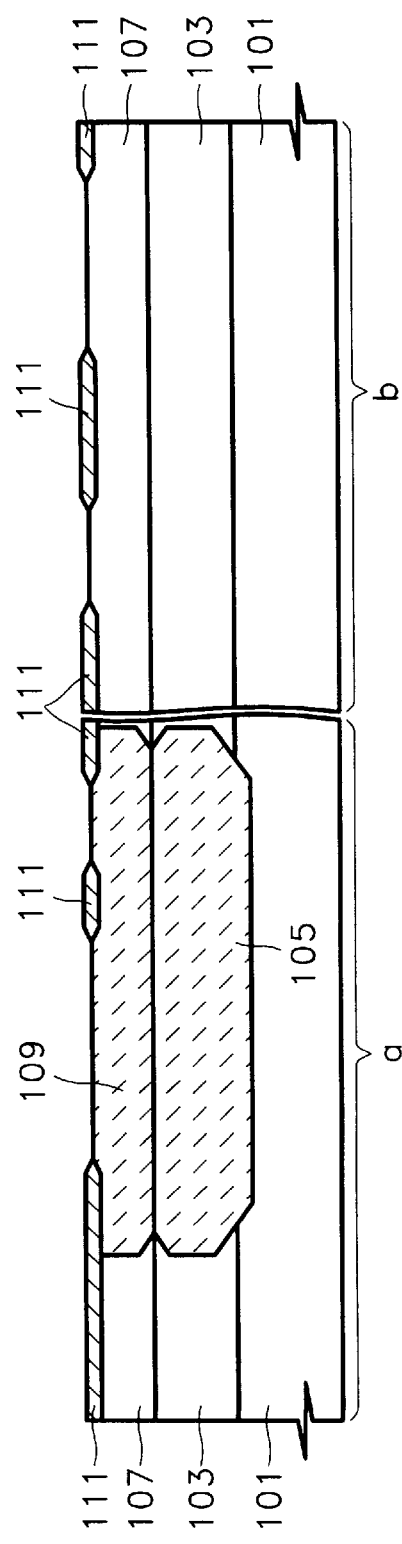

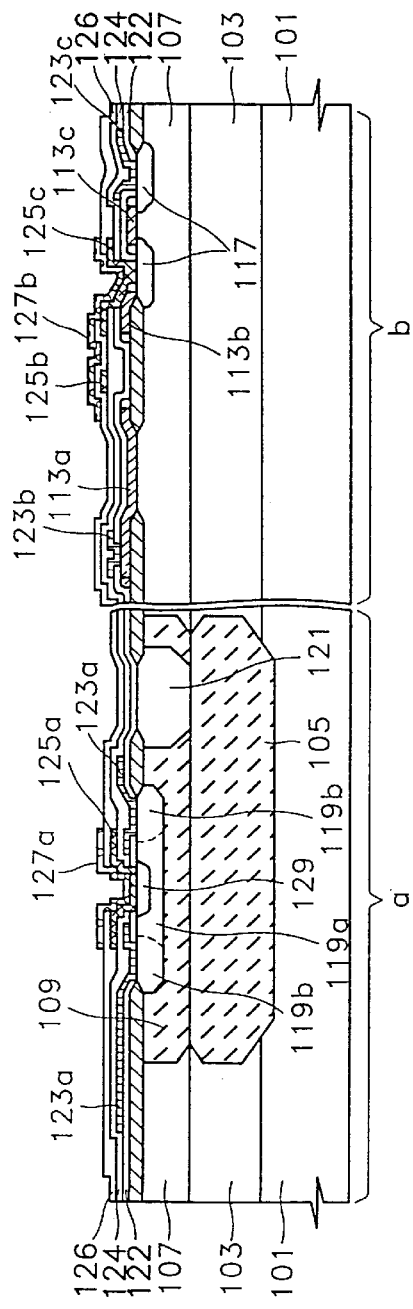
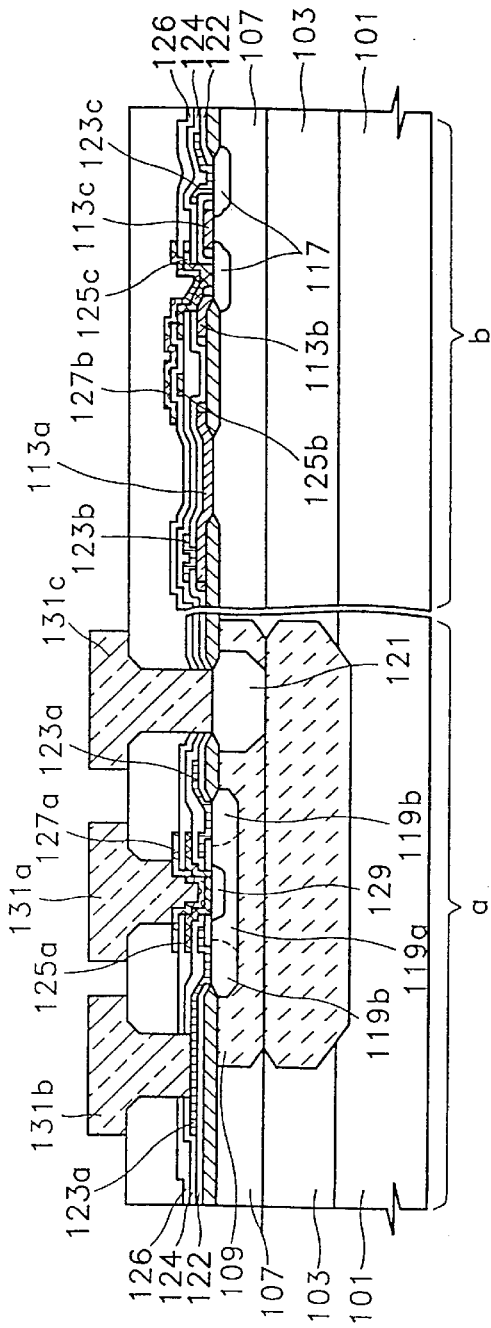

METHODS OF FORMING BICMOS DEVICES HAVING DUAL-LAYER EMITTER ELECTRODES AND THIN-FILM TRANSISTORS THEREIN

FIELD OF THE INVENTION

The present invention generally relates to semiconductor devices, and more particularly, to bipolar transistors suitable for use in BiCMOS devices.

BACKGROUND OF THE INVENTION

The marketplace is currently driving the development of faster and faster semiconductor memory devices. In an effort to produce higher-speed semiconductor memory devices, research into methods for fabricating suitable transistors and related structures are being actively pursued. Among the numerous semiconductor memory device types, the operational speeds of static random access memory (SRAM) devices are typically higher than those of dynamic random access memory (DRAM) devices or read only memory (ROM) devices. Accordingly, SRAM devices are widely used in cache memories for accelerating the data processing speed of a computer. However, since operational speeds of most semiconductor memory devices are increasing, the realization of higher speed SRAM devices is highly desirable. To provide high speed memory devices, the bipolar complementary metal-oxide semiconductor (BiCMOS) technology has been developed. Such BiCMOS SRAM devices include CMOS transistors having high integration and low-power characteristics and high-speed bipolar transistors.

In conventional BiCMOS technology, a bipolar transistor can be formed over a buried layer doped to a high concentration and an epitaxial layer having a relatively low impurity concentration. This configuration reduces the collector resistance of the bipolar transistor, and thereby increases current gain.

FIG. 1 is a cross-sectional view illustrating a bipolar transistor formed by a conventional BiCMOS SRAM fabricating process. In particular, a heavily doped buried layer 5 of a second conductivity type, for example, N-type, is formed on a semiconductor substrate 1 of a first conductivity type, for example, P-type. A heavily doped buried layer 3 of the first conductivity type surrounds buried layer 5. A well region 7 of the first conductivity type and a well region 9 of the second conductivity type are formed of an epitaxial layer on the buried layers 3 and 5, respectively. The well region 9 acts as a collector region of the bipolar transistor. As mentioned above, the buried layer 5, which is adjacent the well region 9, has a relatively high dopant concentration to reduce collector resistance.

An extrinsic collector 11 of the second conductivity type is formed in the well region 9, and is more heavily than the well region 9. Further, the extrinsic collector region 11 contacts the buried layer 5.

An intrinsic base region 13a of the first conductivity type is formed in a predetermined region of the well region 9. A predetermined space should be maintained between the intrinsic base region 13a and the extrinsic collector region 11. An extrinsic base region 13b of the first conductivity type is also formed in a predetermined region of the well region 9 adjacent the intrinsic base region 13a. The extrinsic base region 13b is doped more heavily doped than the intrinsic base region 13a. An emitter region 15 of the second conductivity type is formed on a surface of the intrinsic base region 13a, and an emitter electrode 17 of the second conductivity type is formed thereover, as shown in FIG. 1. Metal interconnections 19a, 19b, and 19c are formed on the emitter electrode 17, the extrinsic base region 13b, and the extrinsic collector region 11, respectively. The metal interconnections 19a and 19b should be spaced apart from each other by at least a predetermined distance in accordance with a minimum design rule. In addition, the emitter electrode 17 and the metal interconnection 19b should also be spaced apart from each other by more than a predetermined distance.

In the bipolar transistor of FIG. 1, the extrinsic base region 13b is formed adjacent the intrinsic base region 13a, and thus, the base current may not flow uniformly across the junction between the base region and the emitter region. Accordingly, the resistance of the intrinsic base region 13a may be increased, reducing the current gain of the bipolar transistor. Also, since the distance between the metal interconnections 19a and 19b, and between the emitter electrode 17 and the metal interconnection 19b, should be larger than a predetermined value, the size of the intrinsic base region 13a and the extrinsic base region 13b may be difficult to reduce beyond a certain point. Otherwise, the intrinsic base region 13a and the extrinsic base region 13b may not be in contact with the metal interconnection 19b and emitter electrode 17. Accordingly, if the areas of the base regions 13a and 13b cannot be reduced, it may be difficult to reduce parasitic junction capacitance between the well region 9 which functions as a collector region and the base regions 13a and 13b. Therefore, it may be difficult to improve driving speed of the bipolar transistor of FIG. 1.

SUMMARY OF THE INVENTION

It is therefore an object of the present invention to provide a method for fabricating a bipolar transistor which can reduce resistance of an intrinsic base region.

It is another object of the present invention to provide a method for fabricating a bipolar transistor with a reduced area of the base region.

These and other objects are provided according to the present invention by methods for forming a bipolar transistor which include the following steps. A collector region of a first conductivity type is formed in a substrate adjacent a surface thereof. A base region of a second conductivity type is then formed in the collector region adjacent the surface of the substrate. A base electrode is formed on a first portion of the substrate adjacent the base region wherein the base electrode comprises a dopant of the second conductivity type. Next, an emitter electrode is formed on a second portion of the substrate adjacent the base region wherein the emitter electrode comprises a dopant of the first conductivity type. The dopant of the second conductivity type from the base electrode is diffused into the first portion of the base region to increase a dopant concentration of the first portion of the base region adjacent the base electrode. The dopant of the first conductivity type from the emitter electrode is diffused into the second portion of the substrate to form an emitter region of the first conductivity type in the base region adjacent the emitter electrode. Advantageously, the first and second diffusion steps can be performed simultaneously in order to reduce the number of steps.

In the above method, the first portion of the substrate adjacent the base region may define a peripheral portion of the base region, and the second portion of the substrate adjacent the base region may define a central portion of the base region surrounded by the peripheral portion so that the base electrode surrounds the emitter electrode.

In addition, the step of forming the emitter electrode may comprise the steps of forming a first polysilicon layer of the first conductivity type on the second portion of the substrate adjacent the base region, and forming a second polysilicon layer of the first conductivity type on the first polysilicon layer opposite the substrate. The step of forming the base electrode may comprise the steps of forming a polysilicon layer of the second conductivity type on the first portion of the substrate adjacent the base region, and forming a tungsten polycide layer on the polysilicon layer opposite the substrate.

A method for forming a BiCMOS device in accordance with the present invention includes the following steps. A collector region of a first conductivity type is formed in a substrate adjacent a surface thereof. A base region of a second conductivity type is then formed in the collector region adjacent the surface of the substrate. A base electrode is formed on a first portion of the substrate adjacent the base region wherein the base electrode comprises a dopant of the second conductivity type. Next, an emitter electrode is formed on a second portion of the substrate adjacent the base region wherein the emitter electrode comprises a dopant of the first conductivity type. The dopant of the second conductivity type from the base electrode is diffused into the first portion of the base region to increase a dopant concentration of the first portion of the base region adjacent the base electrode. The dopant of the first conductivity type from the emitter electrode is diffused into the second portion of the substrate to form an emitter region of the first conductivity type in the base region adjacent the emitter electrode. The first and second diffusion steps can be performed simultaneously in order to reduce the number of steps. A well region of a third conductivity type is then formed in the substrate adjacent the surface. Next, spaced apart source and drain regions of a fourth conductivity type are formed in the well region adjacent the surface of the substrate, wherein the source and drain regions define a channel region therebetween. A gate electrode is then formed on the surface of the substrate adjacent the channel region.

A method for forming a BiCMOS static random acces memory device in accordance with the present invention includes the following steps. A bipolar collector region of a first conductivity type is formed in a substrate adjacent a surface thereof. A bipolar base region of a second conductivity type is then formed in the collector region adjacent the surface of the substrate. A base electrode is formed on a first portion of the substrate adjacent the base region wherein the base electrode comprises a dopant of the second conductivity type. Next, an emitter electrode is formed on a second portion of the substrate adjacent the base region wherein the emitter electrode comprises a dopant of the first conductivity type. The dopant of the second conductivity type from the base electrode is diffused into the first portion of the base region to increase a dopant concentration of the first portion of the base region adjacent the base electrode. The dopant of the first conductivity type from the emitter electrode is diffused into the second portion of the substrate to form an emitter region of the first conductivity type in the base region adjacent the emitter electrode. The first and second diffusion steps can be performed simultaneously in order to reduce the number of steps. A MOS well region of a third conductivity type is then formed in the substrate adjacent the surface. Next, spaced apart MOS source and drain regions of a fourth conductivity type are formed in the MOS well region adjacent the surface of the substrate, wherein the MOS source and drain regions define a channel region therebetween. A gate electrode is then formed on the surface of the substrate adjacent the channel region.

BRIEF DESCRIPTION OF THE DRAWINGS

FIGS. 2 through 7 are cross-sectional views illustrating steps of a method for fabricating a bipolar transistor of a BiCMOS SRAM device according to the present invention.

DETAILED DESCRIPTION OF THE PREFERRED EMBODIMENTS

Figure 1:
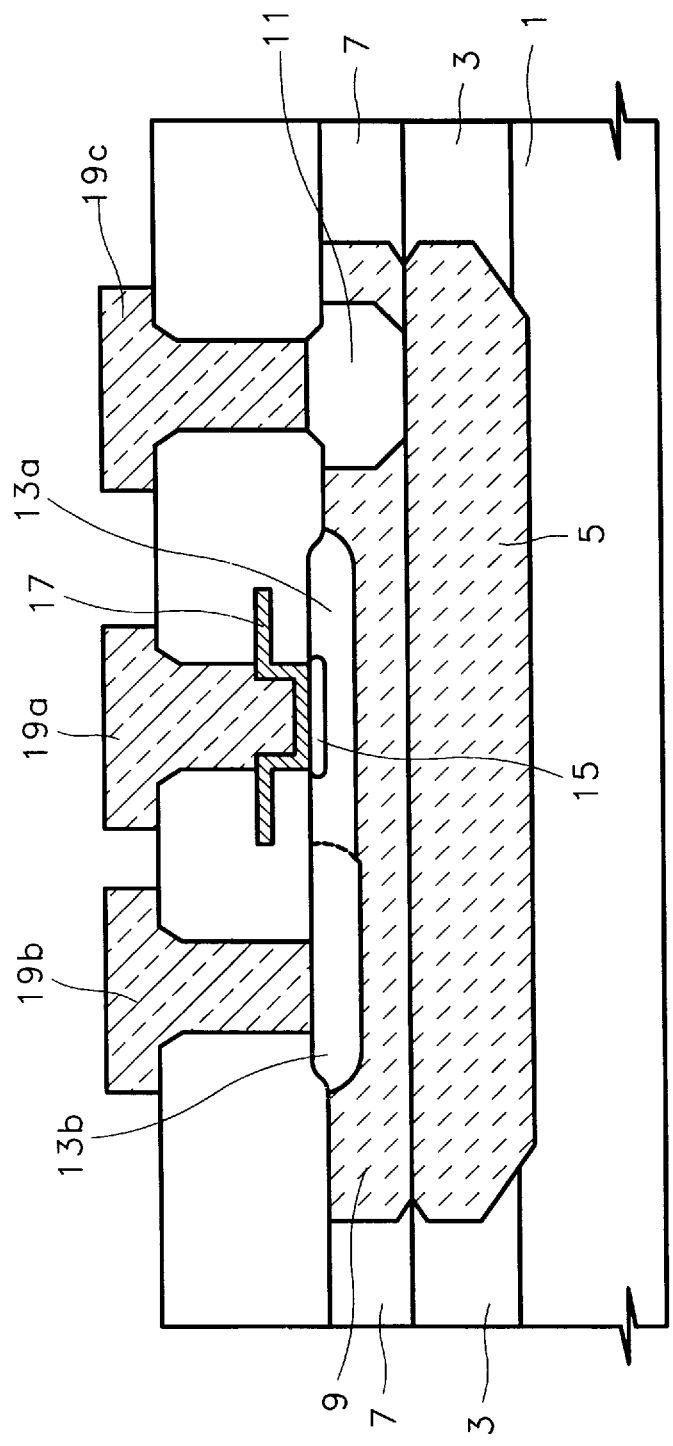
FIG. 1 is a cross-sectional view illustrating a structure of a bipolar transistor of a BiCMOS SRAM device according to the prior art.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thicknesses of the layers and regions are exaggerated for clarity, and are not necessarily drawn to scale. Further, like reference numerals designate like elements throughout.

Referring generally to FIGS. 2 through 7, steps of a method for forming a BiCMOS device are illustrated. This BiCMOS device includes a peripheral circuit "a" where a bipolar transistor is formed, and memory circuit "b" where CMOS transistors are formed.

With reference to FIG. 2, a buried layer 103 of a first conductivity type is formed on a surface of a semiconductor substrate 101 of the first conductivity type. For example, the first conductivity type can be P-type. A buried layer 105 of a second conductivity type, such as N-type, is then formed in the buried layer 103 so that the buried layer 103 essentially surrounds the buried layer 105. The buried layer 105 is heavily doped so as to have sheet resistance of dozens of ohms/square ($\Omega/\square$). The high dopant concentration of the buried layer 105 reduces the collector resistance in a vertical transistor and allows the collector current to flow uniformly over all junction surfaces of an emitter region increasing current gain. As shown in FIG. 2, the buried layer 105 is formed on a predetermined region of the peripheral circuit "a".

A well region 107 of the first conductivity type, a well region 109 of the second conductivity type, and field oxide film 111 are then formed, as shown in FIG. 3. Specifically, an epitaxial layer is formed on the entire surface of the substrate where the buried layers 103 and 105 are formed. Then, dopants of the first and second conductivity types are selectively ion-implanted into the epitaxial layer on the buried layers 103 and 105 to form the well region 107 of the first conductivity type and the well region 109 of the second conductivity type. Also, field oxide films 111 are formed on predetermined regions of a substrate surface to provide device isolation defining active and nonactive regions.

Figure 4:
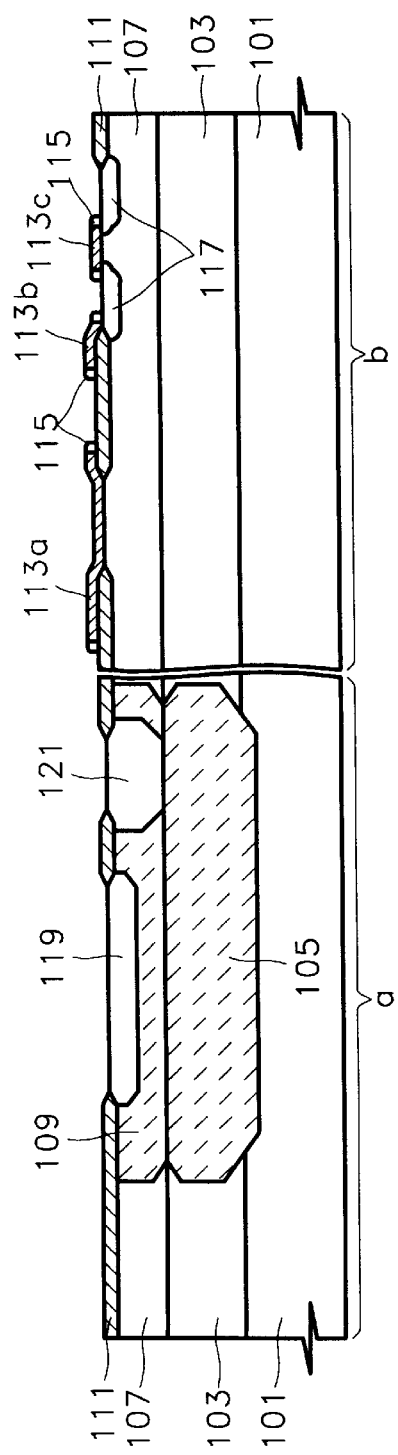

A base region 119 and a high concentration collector region 121 are then formed, as shown in FIG. 4. Particularly, a gate oxide film of an MOS transistor is formed on the active regions. Then, a conductive film, for example, a tungsten polycide film, is formed on the entire surface of the resultant structure. The conductive film is then patterned to form a gate electrode 113a for a pass transistor and gate electrodes 113b and 113c for a driving transistor for a cell of the memory cell circuit "b". In addition, source/drain regions 117 are formed in the well region 107 in a conventional manner. Next, spacers 115 are formed on the sidewalls of the gate electrodes 113a, 113b and 113c of the pass transistor and the driving transistor, and on the active regions of both sides of each gate electrode, as shown. A MOS transistor of the peripheral circuit "a" is formed at the same time.

Next, the base region is formed by implanting dopants of the first conductivity type, such as boron (B) ions, into a surface of one of the active regions of the well region 109. Preferably, the ions are implanted with an energy of about 30 KeV, and at a dose of about 3.0E13 ion atoms/cm$^2$. It is worth noting that the base region 119 can be formed simultaneously with the source/drain regions of a PMOS transistor in the peripheral circuit "a".

In addition, dopants of the second conductivity type, such as phosphorus (P), are ion-implanted into an active region adjacent to the base region 119 to form a high concentration collector region 121. Dopants are also implanted into an active region where a drain region of an NMOS transistor is to be formed for an input/output protection circuit of the peripheral circuit "a" to form a deep drain region. The deep drain region may improve an electro-static discharge (ESD) characteristic of the input/output protection circuit. Preferably, the ions are implanted with an energy of about 180 KeV, and at a dose of about 5.0E15 ion atoms/cm$^2$. It is desirable that the high concentration collector region 121 has a concentration higher than that of the well region 109, and is formed deep enough to contact the buried layer 105.

Figure 5:
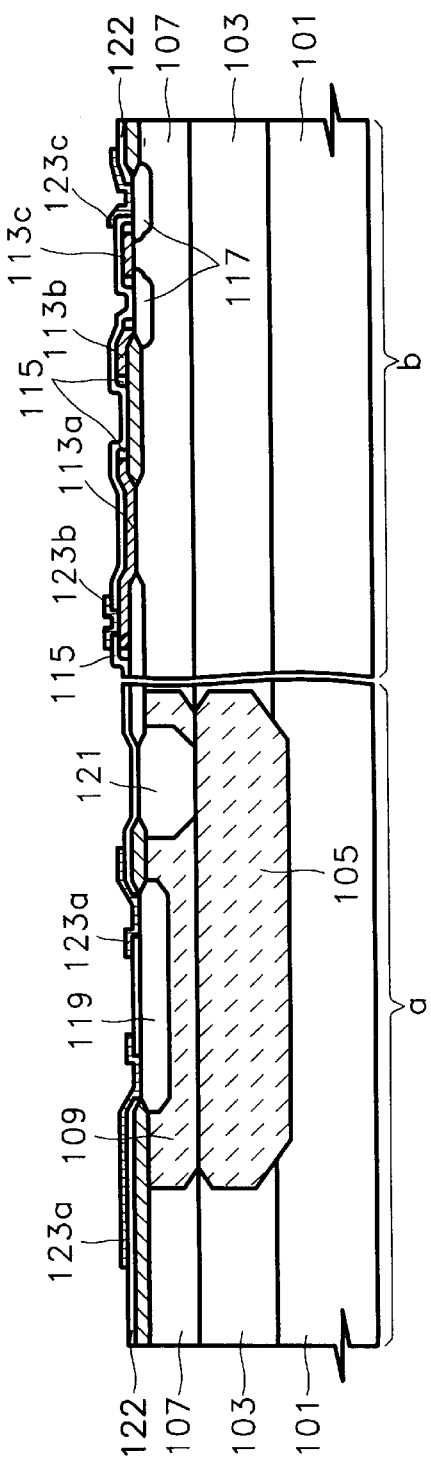

A base electrode 123a, a word line 123b and a ground line 123c are then formed, as shown in FIG. 5. Particularly, a first inter-layer dielectric film is formed on the entire surface of the substrate where the high concentration collector region 121 is formed, and is patterned to form a first inter-layer dielectric film pattern 122 which exposes an edge surface about the periphery of the base region 119, the gate electrode 113a for the pass transistor, and the source region 117 for the driving transistor. Next, an undoped polysilicon film is formed on the entire surface of the substrate where the first inter-layer dielectric film pattern 122 is formed. Impurities of a first conductivity type, for example, BF$_2$, are selectively ion-implanted into a predetermined region of the peripheral circuit "a", i.e., in the undoped polysilicon film of the bipolar transistor region. Preferably, the ions are implanted with an energy of about 30 KeV, and at a dose of about 5.0E15 ion atoms/cm$^2$. Further, impurities of a second conductivity type are selectively ion-implanted into the undoped polysilicon film of the memory cell circuit "b".

A tungsten silicide film having low resistivity is then deposited on the doped polysilicon film. The tungsten silicide film and the doped polysilicon film are then sequentially patterned to form a base electrode 123a that is connected with the edge surface about the periphery of the base region 119 in the peripheral circuit "a". Simultaneously, a word line 123b which is connected to the gate electrode 113a for the pass transistor and a ground line 123c which is connected to the source region 117 for the driving transistor in the memory cell circuit "b" are formed.

A first emitter electrode 125a and a second emitter electrode 127a are then formed, as shown in FIG. 6. Particularly, a second inter-layer dielectric film is formed on the entire surface of the substrate where the base electrode 123a is formed. Then, the second inter-layer dielectric film and a first inter-layer dielectric film pattern 122 are sequentially patterned to form an emitter contact hole and a second inter-layer dielectric film pattern 124 which exposes a central portion of the base region 119. At the same time, a node contact hole is formed which exposes the gate electrode 113b for the first driving transistor and the drain region 117 for the second driving transistor. Also formed at the same time is a second node contact hole which exposes the drain region of the first driving transistor and the gate electrode of the second driving transistor.

A doped conductive film of the second conductivity type is then formed on the entire surface of the substrate where the emitter contact hole and the node contact hole are formed. The conductive film is patterned to form an emitter electrode 125a that is connected to the base region 119 through the emitter contact hole, a gate electrode 125b for a first thin-film transistor, and a gate electrode 125c for a second thin-film transistor in the memory cell circuit "b". The gate electrode 125c for the second thin-film transistor includes an extended portion to cover one node contact hole.

Next, a third inter-layer dielectric film is formed on the entire surface of the substrate where the emitter electrode 125a is formed. The third inter-layer dielectric film is then patterned to form a third inter-layer dielectric film pattern which exposes the first emitter electrode 125a and the gate electrode 125c for the thin film transistor in an upper portion of the node contact hole. The third inter-layer dielectric film is used for a gate insulating film for the thin-film transistor in the memory cell circuit "b", and is preferably formed of an oxide film having a thickness of approximately 300~500 Å.

Further, a polysilicon film having a thickness of approximately 200~500 Å is formed on the entire surface of the resultant structure, and impurities of the second conductivity type, for example, phosphorus (P) ions, are selectively ion-implanted into the polysilicon film of the peripheral circuit "a". Preferably, the impurities are implanted with an energy of about 30 KeV, and at a dose of about 1.0E16 ion atoms/cm$^2$. The selectively ion-implanted polysilicon film is then patterned to form a second emitter electrode 127a that is in contact with the first emitter electrode 125a and is stacked thereon. A channel region for the thin-film transistor and a source/drain region 127b are also formed in the memory cell circuit "b".

As described above, once the first emitter electrode 125a and the second emitter electrode 127a are formed and a subsequent heat treatment step is performed, impurities of the base electrode 123a and the first emitter electrode 125a are diffused into the base region 119 to form an emitter region 129 of the second conductivity type and high concentration base region 119b of the first conductivity type, respectively. The emitter region 129 is formed on a surface of the base region 119 and is in contact with the first emitter electrode 125a. The high concentration base region 119b is formed on the outer edge or periphery of the base region 119 in essentially the shape of a ring. The high concentration base region 119b is also in contact with the base electrode 123a. Further, an active base region 119a surrounded by the high concentration base region 119b is defined. Accordingly, it is possible to obtain base current having uniform density throughout the junction surface of the emitter region 129.

Next, metal interconnections 131a, 131b, and 131c are formed, as shown in FIG. 7. Particularly, a planar insulating film that flows at a high temperature, for example, a BPSG film, is formed on the surface of the substrate where the second emitter electrode 127a is formed. Metal contact holes which expose the second emitter electrode 127a, the base electrode 123a and the high concentration collector region 121 is formed. The metal contact hole that exposes the base electrode 123a should be spaced a predetermined distance from the high concentration base region 119b in order to be sufficiently spaced from the metal contact hole exposing the second emitter electrode 127a. Next, the metal interconnections 131a, 131b, and 131c are formed for covering the metal contact holes.

Thus, a method in accordance with the present invention for fabricating a bipolar transistor comprises the following steps. A buried layer of a second conductivity type that is heavily doped is formed on a predetermined region of a substrate of a first conductivity type. A well region of a second conductivity type is then formed on the buried layer. A base region is then fomed in the well region by doping impurities of the first conductivity type into a predetermined region of a surface of the well region. Next, impurities of the second conductivity type are doped into a second region of the surface of the well region adjacent to the base region, thereby forming a high concentration collector region that is doped in a higher concentration than the well region and that is contacting the buried layer. A first inter-layer dielectric film pattern is formed so as to expose a surface of the base region, and a base electrode is formed covering the exposed surface of the base region. The base electrode is doped with impurities of the first conductivity type. A second inter-layer dielectric film pattern is formed having an emitter contact hole exposing a central portion of said base region. A first emitter electrode is then formed so as to cover the emitter contact hole. The first emitter electrode is doped with impurities of the second conductivity type. A third inter-layer dielectric film pattern is formed that exposes a portion of the first emitter electrode. Next, a second emitter electrode is formed covering the exposed portion of the first emitter electrode. The second emitter electrode is doped with impurities of said second conductivity type. Lastly, the transistor structure is annealed to diffuse impurities in the base electrode and in the first and second emitter electrodes to form a high concentration base region on the exposed surface of the base region and an emitter region on the central portion of the exposed surface of the base region, respectively.

In the method above, the well region is preferably formed by forming an epitaxial layer on the buried layer, and then selectively ion-implanting the impurities of the second conductivity type into the epitaxial layer on the buried layer. Further, the base electrode is preferably a tungsten polycide film formed by the steps of sequentially forming a polysilicon film doped with P-type impurities and a tungsten polycide film. In such a case, the polysilicon film doped with P-type impurities is preferably formed to a thickness of approximately 2000 Å. In addition, the first emitter electrode is preferably formed of a polysilicon film to a thickness of approximately 1000 Å.

Accordingly, a BiCMOS SRAM transistor including a high performance bipolar transistor can be formed. Moreover, since the high concentration base region of the bipolar transistor surrounds the emitter region, base current can be uniformly distributed throughout the junction surface of the emitter region. Therefore, resistance of the base region can be reduced, thereby increasing current gain.

Further, the base electrode 123a is directly connected with the high concentration base region 119b and extends radially from peripheral portion of the base region. The metal interconnection is formed on the extended portion of the base electrode so that a sufficient interval is maintain between the metal interconnection connected to the second emitter electrode 127a and the metal interconnection connected to the base electrode 119b. Accordingly, the area of the base region 19 may be reduced without limitation from the interval required between the metal interconnections. Consequently, the area of the base region can be reduced to reduce the parasitic junction capacitance between the base region and the collector region, thereby improving the switching speed and the frequency characteristics of the bipolar transistor. As a result, the high performance bipolar transistor suitable for an ultra high speed BiCMOS SRAM device can be realized.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A method of forming a BiCMOS semiconductor device, comprising the steps of:

forming base and collector regions of a bipolar junction transistor in a semiconductor substrate;

forming an insulated-gate field effect transistor having source and drain regions in the semiconductor substrate;

forming a first emitter electrode of first conductivity type in contact with the base region while simultaneously forming a first gate electrode of a first thin-film transistor adjacent the insulated-gate field effect transistor;

forming an electrically insulating layer on the first emitter electrode and first gate electrode;

patterning the electrically insulating layer to expose a portion of the first emitter electrode; and forming a second emitter electrode of first conductivity type on the exposed portion of the first emitter electrode while simultaneously forming a first active region of the first thin-film transistor on the electrically insulating layer so that the first active region extends opposite the first gate electrode.

2. The method of claim 1, further comprising the step of diffusing dopants of first conductivity type from the first emitter electrode into the base region to define an emitter region therein.

3. The method of claim 1, further comprising the step of simultaneously diffusing dopants of first conductivity type from the first emitter electrode and second emitter electrode into the base region to define an emitter region therein.

4. The method of claim 1, wherein said step of forming a first gate electrode of a first thin-film transistor comprises forming a first gate electrode of a first thin-film transistor in contact with the drain region of the insulated-gate field effect transistor.

5. The method of claim 2, wherein said step of forming a first emitter electrode is preceded by the step of forming a base electrode of second conductivity type in contact with the base region; and wherein said step of diffusing dopants of first conductivity type from the first emitter electrode into the base region comprises diffusing dopants of first conductivity type from the first emitter electrode into the base region to define an emitter region therein while simultaneously diffusing dopants of second conductivity type from the base electrode into the base region.

6. The method of claim 1, wherein said step of forming a first emitter electrode comprises forming a second gate electrode of a second thin-film transistor adjacent the first thin-film transistor; and wherein said step of forming a second emitter electrode comprises forming a second active region of the second thin-film transistor on the electrically insulating layer so that the second gate electrode extends opposite the second active region.

7. The method of claim 6, wherein the first and second active regions are contiguous.

8. The method of claim 5, wherein the base electrode comprises a composite layer of a polycrystalline silicon layer and a metal silicide layer.

9. The method of claim 8, wherein the base electrode is formed by patterning the composite layer as the base electrode and as a word line of a memory device.

10. A method of forming a bipolar junction transistor, comprising the steps of:

forming a semiconductor substrate containing a collector region of first conductivity type therein extending to a face thereof and an intrinsic base region of second conductivity type in the collector region and forming a P-N junction therewith;

forming a first electrically insulating layer on the intrinsic base region;

patterning the first electrically insulating layer to expose a first portion of the intrinsic base region;

forming a base electrode of second conductivity type in contact with the exposed first portion of the intrinsic base region;

forming a second electrically insulating layer on the base electrode and on a portion of the first electrically insulating layer extending opposite the intrinsic base region;

patterning the second electrically insulating layer and the first electrically insulating layer to expose a second portion of the intrinsic base region;

forming a first emitter electrode layer of first conductivity type in contact with the exposed second portion of the intrinsic base region;

forming a third electrically insulating layer on the first emitter electrode layer, opposite the intrinsic base region;

patterning the third electrically insulating layer to expose a portion of the first emitter electrode layer extending opposite the intrinsic base region;

forming a second emitter electrode layer of first conductivity type in contact with the first emitter electrode layer; and diffusing dopants of first conductivity type from the first and second emitter electrode layers into the intrinsic base region to define an emitter region of first conductivity type therein while simultaneously diffusing dopants of second conductivity type from the base electrode into the intrinsic base region to define an extrinsic base region therein.

11. The method of claim 10, wherein said diffusing step comprises diffusing dopants of second conductivity type from the base electrode into the intrinsic base region to define an extrinsic base region therein which surrounds the emitter region.

12. The method of claim 10, wherein the base electrode comprise a composite of a polysilicon layer and a refractory metal silicide layer; and wherein the first and second emitter electrode layers comprise polysilicon.

13. The method of claim 10, further comprising the step of forming an insulated-gate field effect transistor in the semiconductor substrate; and wherein said step of forming a first emitter electrode layer comprises forming a first emitter electrode layer while simultaneously forming a first gate electrode of a first thin-film transistor adjacent the insulated-gate field effect transistor.

14. The method of claim 13, wherein said step of forming a first gate electrode comprises forming a first gate electrode of a first thin-film transistor in contact with a drain region of the insulated-gate field effect transistor.

* * * * *